Aug. 14, 1962 R. R. STONE, JR 3,049,674
FREQUENCY SYNTHESIZER EMPLOYING AT LEAST
ONE FREQUENCY DRIFT CANCELLATION LOOP
Filed April 30, 1959 2 Sheets-Sheet 1

INVENTOR
ROBERT R. STONE, JR.

BY Richard C. Reed

ATTORNEY

FREQUENCY SYNTHESIZER EMPLOYING AT LEAST ONE FREQUENCY DRIFT CANCELLATION LOOP

Filed April 30, 1959 2 Sheets-Sheet 2

INVENTOR
ROBERT R. STONE, JR.

BY Richard P. Reed

ATTORNEY

United States Patent Office 3,049,674
Patented Aug. 14, 1962

3,049,674

FREQUENCY SYNTHESIZER EMPLOYING AT LEAST ONE FREQUENCY DRIFT CANCELLATION LOOP

Robert R. Stone, Jr., Rosecroft Park, Md., assignor to the United States of America as represented by the Secretary of the Navy Filed Apr. 30, 1959, Ser. No. 810,188
6 Claims. (Cl. 331—39)
(Granted under Title 35, U.S. Code (1952), sec. 266)

The invention described herein may be manufactured and used by or for the Government of the United States of America for governmental purposes without the payment of any royalties thereon or therefor.

This invention relates in general to a signal generator and in particular to a frequency synthesizer employing at least one frequency drift cancellation loop.

In the field of electronics, it is often desired to generate a signal having a stable, accurate frequency that can be varied in discrete increments over a predetermined band of frequencies. The signal may be used, for example, to drive a transmitter or as the output of a local oscillator in a receiver. The frequency synthesizers in the prior art in general require several expensive components, are large and cumbersome, and in addition, fail to provide a signal with the accuracy required in such applications as frequency measurement in single sideband systems.

Accordingly, it is an object of the present invention to provide a compact, accurate frequency synthesizer.

Another object is to provide a synthesizer capable of supplying a frequency at selected points in a spectrum having the accuracy of a standard source and a frequency between the points that has only the frequency error of an interpolation oscillator.

Figure 1:
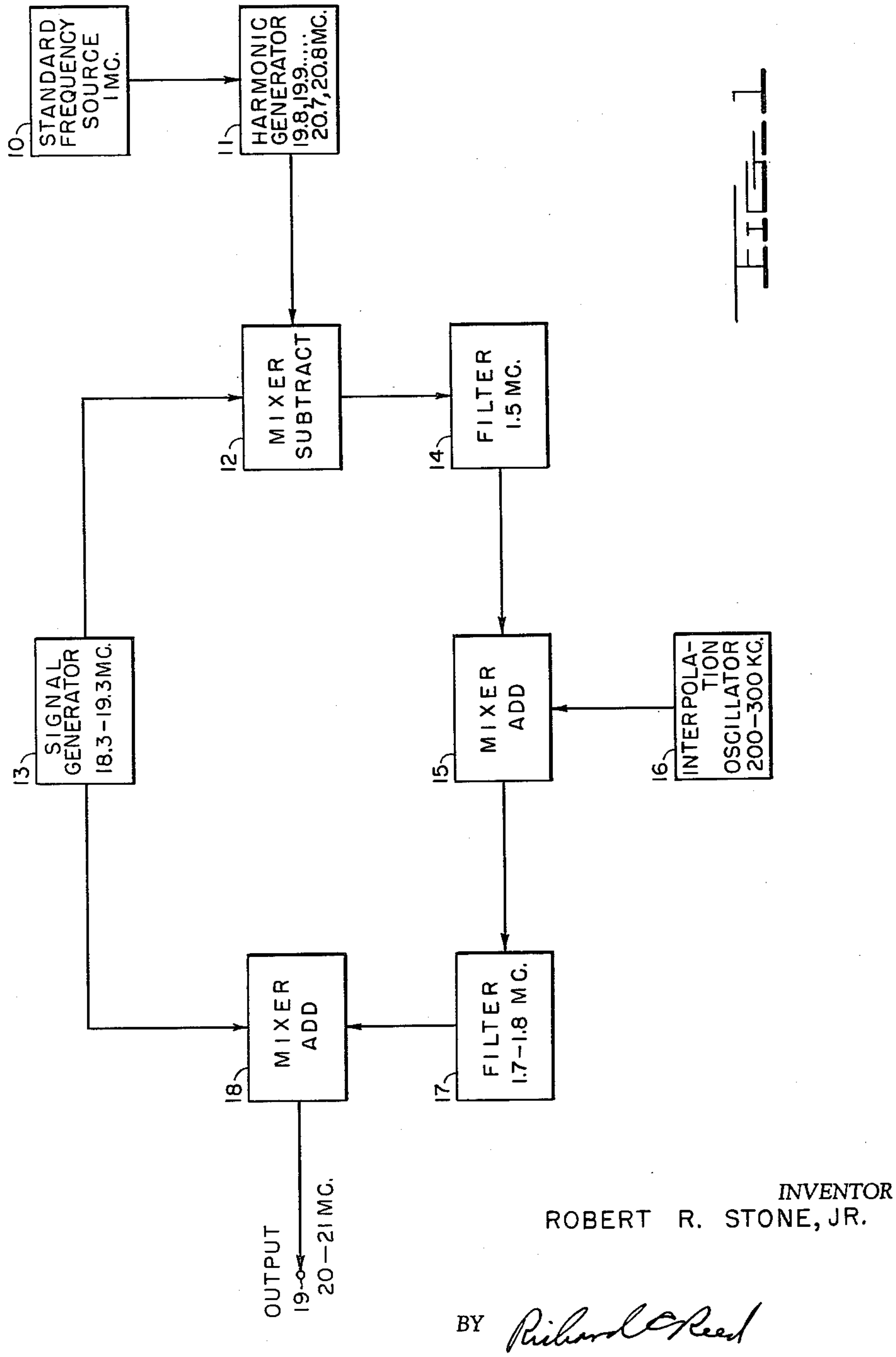

Other objects and advantages of the invention will hereinafter become more fully apparent from the following description of the annexed drawings wherein:

FIG. 1 discloses a first embodiment of the present invention.

Figure 2:
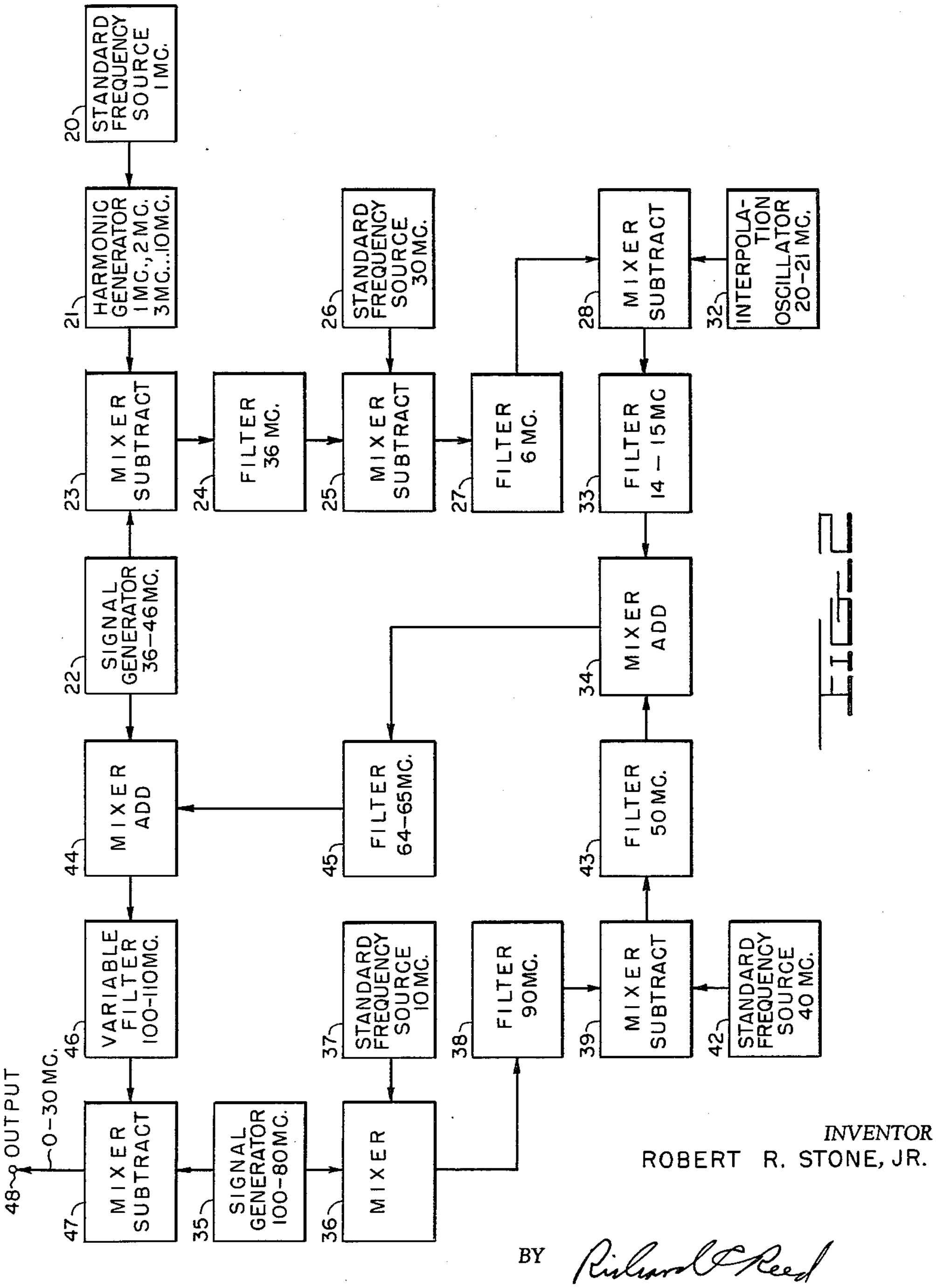

FIG. 2 discloses a second embodiment of the present invention.

In accordance with the teachings of the present invention, a desired signal is formed in a frequency synthesizer by the addition and subtraction of selected frequencies. The frequency synthesizer achieves extremely high frequency control by utilizing at least one frequency drift cancellation loop. In one embodiment, for example, a first mixer, filter, second mixer, filter, and third mixer are connected in series; a signal generator is connected between the first and third mixer to form a loop. To generate a desired signal, a block of frequencies is applied to the first mixer and the output of an interpolation oscillator is fed to the second mixer. The signal generator is adjusted to provide a selected frequency that is added to the input of the third mixer and subtracted from the input of the first mixer so that frequency drift or inaccuracy of the selected frequency is cancelled and the frequency accuracy of the output of the loop is that of the interpolation oscillator. Several loops are connected together to form a frequency synthesizer that is very stable and accurate in operation over a wide range of frequencies.

The embodiments shown in FIGS. 1 and 2 will be described with the aid of numerical examples but it is to be understood that these numerical examples are given by way of illustration only and that the invention is not limited to the use of specific frequencies.

Referring to FIG. 1, standard frequency source 10 applies a signal having a frequency of 1 mc. to harmonic generator 11 which provides a block of frequencies in 100 kc. steps in a spectrum that extends from 19.8 to 20.8 mc. The output of harmonic generator 11 is fed to mixer 12 where each frequency of the block is subtracted from the selected output frequency of signal generator 13. Signal generator 13 produces selected signals in 100 kc. steps from 18.3 to 19.3 mc. The signal in the output of mixer 12 having a 1.5 mc. frequency is passed through filter 14 to mixer 15 where it is added to the output of interpolation oscillator 16 to obtain a signal that is fed through filter 17 to mixer 18. The output of the interpolation oscillator may be continuously varied from 200 to 300 kc. while filter 17 is adapted to pass a signal located in a band extending from 1.7 to 1.8 mc. In mixer 18, the output of signal generator 13 and the signal passed by filter 17 are added to provide a signal at output terminal 19 that may be varied continuously in a frequency range that extends from 20 to 21 mc.

In a typical operation of the embodiment shown in FIG. 1, if it is desired to generate a 20 mc. signal, signal generator 13 is adjusted to apply 18.3 mc. to mixer 12 where the applied signal is subtracted from the frequencies 19.8, 19.9 . . . 20.7, 20.8 mc. to provide signals having frequencies equal to 1.5, 1.6 . . . 2.4, 2.5 mc., respectively. The 1.5 mc. signal is passed through filter 14 to mixer 15. Interpolation oscillator 16 is adjusted to apply 0.2 mc. to mixer 15 where it is added to the 1.5 mc. signal obtaining 1.7 mc. which is applied to mixer 18 through filter 17. Since the signal supplied by signal generator 13 varies from 18.3 mc. by a frequency equal to $e$, the signal applied to mixers 15 and 18 will be $(1.5-e)$ and $(1.7-e)$, respectively. In mixer 18, $(18.3+e)$ mc. is added to $(1.7-e)$ mc. to produce the desired signal having a frequency of 20 mc. Because any frequency drift or inaccuracy in the output of signal generator 13 will be compensated for in the manner indicated above, the output signal in FIG 1 is extremely accurate having the frequency error of only interpolation oscillator 16. Thus, if the interpolation oscillator varies $\pm 0.1$ cycle from 0.2 mc., the output signal will vary only $+0.1$ cycle from 20 mc.

Referring to FIG. 2, standard frequency source 20 applies a signal having a frequency of 1 mc. to harmonic generator 21 which provides a block of frequencies ranging from 1 to 10 mc., the frequencies being separated by 1 mc. Signal generator 22 produces signals in 1 mc. steps from 36 to 46 mc. The output of harmonic generator 21 is fed to mixer 23 where each frequency in the block is subtracted from the selected output frequency of signal generator 22. The signal in the output of mixer 23 having a frequency equal to 36 mc. is passed through filter 24 to mixer 25 where it is subtracted from the 30 mc. signal provided by standard frequency source 26 to obtain 6 mc. The latter signal is sent through filter 27 to mixer 28. Interpolation oscillator 32 supplies a continuously variable output between 20 and 21 mc. which is applied to mixer 28 and subtracted therein from the output of filter 27 deriving a signal that is fed through filter 33 to mixer 34. Filter 33 is adapted to pass a signal having a frequency between 14 and 15 mc.

Signal generator 35 supplies a signal from 80 to 100 mc. in 10 mc. steps to mixer 36 where it is amplified unchanged, or added to, or subtracted from the 10 mc. output of standard frequency source 37 to provide a 90 mc. signal that is passed through filter 38 to mixer 39. In mixer 39, the 90 mc. signal is subtracted from the 40 mc. output of standard frequency source 42 to derive a 50 mc. signal that is sent through filter 43 to mixer 34, added therein to the output of filter 33 to obtain a signal that is supplied to mixer 44 through filter 45. The latter filter is adapted to pass frequencies between 64 and 65 mc. while variable filter 46 is selected to pass a signal between 100 and 110 mc. in 1 mc. steps. The signal provided by signal generator 22 is applied to mixer 44. And finally, the output of signal generator 35 is subtracted from that of variable filter 46 in mixer 47 to obtain a signal at output terminal 48 that may have a selected frequency located between 0 and 30 mc.

In a typical operation of the embodiment shown in FIG. 2, assume that it is desired to generate a signal having a frequency of 21.5 mc. Signal generator 22 is adjusted to provide 37 mc. which is applied to mixer 23 and subtracted therein from each of the block of frequencies 1 mc., 2 mc., 3 mc. . . . 10 mc. to obtain 36 mc., 35 mc., 34 mc. . . 27 mc., respectively. The 36 mc. signal is passed by filter 24 to mixer 25 where 30 is subtracted from 36 mc. obtaining 6 mc. which is sent through filter 27 to mixer 28. Since the signal produced by signal generator 22 deviates from 37 mc. by a frequency $e$, the output of filter 27 will be $(6+e)$ mc. Signal generator 32 is adjusted to apply 20.5 mc. to mixer 28. In this mixer, $(6+e)$ is subtracted from 20.5 mc. to derive a $(14.5-e)$ mc. signal which is fed through filter 33 to mixer 34.

Signal generator 35 is adjusted to apply 80 mc. to mixer 36 where 10 mc. is added to provide a 90 mc. signal that is passed through filter 38 to mixer 39. Because the signal provided by signal generator 35 varies from 80 mc. by a frequency $ef$, the signal applied to mixer 39 will be $(90+ef)$ mc. In mixer 39, the 40 mc. signal is subtracted from $(90+ef)$ to supply a signal having a frequency equal to $(50+ef)$ mc. through filter 43 to mixer 34. The $(14.5-e)$ mc. and $(50+ef)$ mc. signals fed through filters 33 and 43, respectively, to mixer 34 are added in the mixer to provide a signal having a frequency equal to $(64.5-e+ef)$ mc. which is fed through filter 45 to mixer 44. In mixer 44, $(64.5-e+ef)$ mc. is added to $(37+\ )$ mc. applied by signal generator 22 to obtain $(101.5+ef)$ mc. The latter signal is passed through variable filter 46 to mixer 47 where $(80+ef)$ is subtracted therefrom providing the desired signal 21.5 mc. at output terminal 48.

Various modifications are contemplated and may obviously be resorted to by those skilled in the art without departing from the spirit and scope of the invention, as hereinafter defined by the appended claims, as only preferred embodiments thereof have been disclosed.

What is claimed is:

1. In a frequency synthesizer, first, second, and third means, each including a filter connected to the output of a mixer, means for connecting the output of said first means to the input of said second means and the output of said second means to the input of said third means, a first mixer, means for connecting said first mixer to the output of said third means, a first signal generator, means for applying the output of said first signal generator to said first mixer and the mixer in said first means, signal generating means for providing a block of frequencies, means for applying the output of said signal generating means to the mixer in said first means, an interpolation oscillator, means for applying the output of said interpolation oscillator to the mixer in said second means, fourth and fifth means, each including a filter connected to the output of a mixer, means for connecting the output of said fourth means to the input of said fifth means and the output of said fifth means to the mixer in said third means, a second mixer, a second signal generator connected between said second mixer and the mixer in said fourth means, a variable filter connected between said first and second mixers, a first standard frequency source, means for applying the output of said first standard frequency source to the mixer in said fourth means, a second standard frequency source, means for applying the output of said second standard frequency source to the mixer in said fifth means, an output terminal, and means for connecting said output terminal to said second mixer.

2. In a frequency synthesizer, first, second, third and fourth means, each including a filter connected to the output of a mixer, means for connecting the output of said first means to the input of said second means, the output of said second means to the input of said third means, and the output of said third means to the input of said fourth means, a first mixer, means for connecting said first mixer to the output of said fourth means, a first signal generator connected between said first mixer and the mixer in said first means, signal generating means for providing a block of frequencies, means for applying the output of said signal generating means to the mixer in said first means, a first standard frequency source, means for applying the output of said first standard frequency source to the mixer in said second means, an interpolation oscillator, means for applying the output of said interpolation oscillator to the mixer in said third means, fifth and sixth means, each including a filter connected to the output of a mixer, means for connecting the output of said fifth means to the input of said sixth means and the output of said sixth means to the mixer of said fourth means, a second mixer, a second signal generator connected between said second mixer and the mixer in said fifth means, a variable filter connected between said first and second mixers, a second standard frequency source, means for applying the output of said second standard frequency source to the mixer in said fifth means, a third standard frequency source, means for applying the output of said third standard frequency source to the mixer in said sixth means, an output terminal, and means for connecting said output terminal to said second mixer, 3. In a frequency synthesizer, signal generating means for providing a block of frequencies, a first signal generator providing a first selected frequency, first mixer means for obtaining a difference frequency output, means connecting said signal generating means and said first signal generator to said first mixer means, a first filter connected to the output of said first mixer means, an interpolation oscillator, second mixer means for obtaining a difference frequency output, means connecting said first filter and said interpolation oscillator to said second mixer means, a second filter connected to the output of said second mixer means, a second signal generator providing a second selected frequency, a third filter, means connecting said third filter to the output of said second signal generator, third mixer means for obtaining a sum frequency output, means connecting said second and third filters to said third mixer means, a fourth filter connected to the output of said third mixer means, fourth mixer means for obtaining a sum frequency output, means connecting said first signal generator and said fourth filter to said fourth mixer means, a fifth filter connected to the output of said fourth mixer means, fifth mixer means for obtaining a difference frequency output, means connecting said fifth filter and said second signal generator, output means, and means connecting said output means to said fifth mixer means.

4. The structure as defined in claim 3 wherein said means connecting said first filter to said second mixer means includes a sixth mixer means for obtaining a difference frequency output, a first standard frequency source and a sixth filter with said first filter and said first standard frequency source connected to said sixth mixer means and said sixth filter connected between the output of said sixth mixer means and said second mixer means.

5. The structure as defined in claim 3 wherein said means connecting said third filter to the output of said second signal generator includes seventh mixer means for obtaining a sum frequency output, a second standard frequency source, a seventh filter, eighth mixer means for obtaining a difference frequency output and a third standard frequency source with said second signal generator and said second standard source connected to said seventh mixer, said seventh filter connected between the output of said seventh mixer means and said eighth mixer means, said third standard frequency source connected to said eighth mixer means, and the output of said eighth mixer connected to said third filter.

6. The structure as defined in claim 4 wherein said means connecting said third filter to the output of said second signal generator includes seventh mixer means for obtaining a sum frequency output, a second standard frequency source, a seventh filter, eighth mixer means for obtaining a difference frequency output and a third standard frequency source with said second signal generator and said second standard source connected to said seventh mixer, said seventh filter connected between the output of said seventh mixer means and said eighth mixer means, said third standard frequency source connected to said eighth mixer means, and the output of said eighth mixer connected to said third filter.

References Cited in the file of this patent

UNITED STATES PATENTS

| | | |
|---|---|---|
| 2,666,141 | Clapp et al. | Jan. 12, 1954 |
| 2,745,962 | Wojciechowski | May 15, 1956 |
| 2,781,450 | Ianouchewsky | Feb. 12, 1957 |

FOREIGN PATENTS

| | | |
|---|---|---|
| 610,599 | Great Britain | Oct. 18, 1948 |
| 654,355 | Great Britain | June 13, 1951 |